United States Patent [19]

Ueki

[11] Patent Number: 4,771,009
[45] Date of Patent: Sep. 13, 1988

[54] PROCESS FOR MANUFACTURING SEMICONDUCTOR DEVICES BY IMPLANTATION AND DIFFUSION

[75] Inventor: Yoshio Ueki, Tokyo, Japan

[73] Assignee: Sony Corporation, Tokyo, Japan

[21] Appl. No.: 27,209

[22] PCT Filed: Jun. 17, 1985

[86] PCT No.: PCT/JP85/00339

§ 371 Date: Feb. 17, 1987

§ 102(e) Date: Feb. 17, 1987

[87] PCT Pub. No.: WO86/07652

PCT Pub. Date: Dec. 31, 1986

[51] Int. Cl.$^4$ ............... H01L 21/385; H01L 21/425
[52] U.S. Cl. ......................... 437/12; 437/31; 437/152; 437/161; 437/28
[58] Field of Search ............... 427/12, 161, 152, 31

[56] References Cited

U.S. PATENT DOCUMENTS

| | | | |
|---|---|---|---|
| 3,759,762 | 9/1973 | Barone et al. | 437/12 |
| 3,791,884 | 2/1974 | Dathe et al. | 437/12 |
| 3,806,371 | 4/1974 | Barone et al. | 437/161 X |
| 3,874,936 | 4/1975 | d'Hervilly et al. | 437/12 X |
| 4,279,671 | 7/1981 | Komatsu | 437/12 |
| 4,370,180 | 1/1983 | Azuma et al. | 437/12 X |
| 4,393,575 | 7/1983 | Dunkley et al. | 437/12 X |
| 4,567,645 | 2/1986 | Cavanagh et al. | 437/12 X |
| 4,589,928 | 5/1986 | Dalton et al. | 437/12 X |

Primary Examiner—George T. Ozaki
Attorney, Agent, or Firm—Hill, Van Santen, Steadman & Simpson

[57] ABSTRACT

A process for manufacturing semiconductor devices according to the present invention comprises a step for thermally oxidizing semiconductor substrates (1), (12), to form first and second oxide films (24), (25) on one main surface and on another main surface thereof, respectively; a step for selectively implanting impurity inons via said first oxide film (24) to form elements in said semiconductor substrates (1), (12); a step for successively forming a film (30) that constitutes a source of impurity diffusion and a protective film (31) on said second oxide film (25); and a step of common heat-treatment for forming predetermined diffused layers (17), (18) on said one main surface of said semiconductor substrates (1), (12) by diffusing at least one kind of the impurity ions that are implanted, and for forming a diffused layer on said another main surface of the semiconductor substrates (1), (12) by diffusing impurities contained in the film (30) that constitutes said source of impurity diffusion into said semiconductor substrates (1), (12) via said second oxide film (25).

This makes it possible to effectively remove impurity atoms such as heavy metals present in the semiconductor substrate (1) and to perform the gettering of very fine defects. Further, the protective film (31) prevents adverse effects caused by the heat-treatment that is effected for forming diffused layers (17), (18). Therefore, a semiconductor device having improved reliability can be produced. Moreover, the manufacturing steps can be simplified, and various impurities can be used to form elements, presenting great convenience from the standpoint of production.

1 Claim, 4 Drawing Sheets

PROCESS FOR MANUFACTURING SEMICONDUCTOR DEVICES BY IMPLANTATION AND DIFFUSION

DESCRIPTION

1. Technical Field

The present invention relates to a process for manufacturing semiconductor devices which permits the elimination of impurity atoms such as heavy metals present in semiconductor substrates to be used for the formation of semiconductor devices and the gettering of very fine defects.

2. Background Art

So far the above gettering has been performed by the following procedures in a conventional process for manufacturing a semiconductor device, as shown in, e.g., FIGS. 1A to 1E. As shown in FIG. 1A, both main surfaces of, e.g., a p-type silicon substrate 1 are thermally oxidized to form $SiO_2$ films 2 and 3 thereon. As shown in FIG. 1B, the $SiO_2$ film 3 on the lower surface of the silicon substrate 1 is then removed by an etching solution such as an HF-based solution. In this case, the $SiO_2$ film 2 is covered in advance with a photoresist (not shown) so that the film 2 is prevented from being etched.

After the photoresist is removed from the $SiO_2$ film 2, the resultant structure is heated to a high temperature of 1,000° C. or more in an $O_2$ atmosphere by using $POCl_3$ as a source of impurity diffusion, thereby performing impurity diffusion. As a result, a phosphorus diffused layer 4 is formed on the lower surface of the p-type silicon substrate 1, as shown in FIG. 1C. At the same time, $P_2O_5$-based PSG (phosphorus-silica-glass) films 5 and 6 are formed on the phosphorus diffused layer 4 and the $SiO_2$ film 2 on the upper surface of the substrate, respectively.

As shown in FIG. 1D, an $SiO_2$ film 7 is deposited by a CVD method on the PSG film 5 formed on the lower surface side. Thereafter, as shown in FIG. 1E, a photoresist 8 is applied to the $SiO_2$ film 7.

After a photoresist (not shown) is applied to the PSG film 6 on the upper surface side, the photoresist film is patterned in a predetermined shape. Using this photoresist pattern as a mask, the PSG film 6 and the $SiO_2$ film 2 are etched using an HF-based etching solution to define an element formation region and an element isolation region. During etching, the $SiO_2$ film 7 and the PSG film 5 are prevented from being etched owing to the presence of the photoresist 8. A predetermined manufacturing process such as a bipolar IC manufacturing process is then performed to prepare a semiconductor device.

In the step of FIG. 1D, if after the formation of the $SiO_2$ film 7 an $Si_3N_4$ film having an etching resistant property against the HF-based etching solution is formed thereon, it becomes unnecessary to form the photoresist 8 in FIG. 1E.

According to the conventional manufacturing process described above, the gettering can effectively be performed owing to the presence of the phosphorus diffused layer 4 formed on the lower surface of the p-type silicon substrate 1. At the same time, the $SiO_2$ film 7 can prevent an out diffusion of phosphorus from the phosphorus diffused layer 4 and the PSG film 5 in a heat-treatment at a high temperature in the steps following the step of FIG. 1E. According to the manufacturing process described above, however, the steps in FIGS. 1A to 1E are required only for the gettering. Accordingly, such a process has a drawback that the number of steps required for manufacturing the semiconductor device is increased, thereby making the manufacturing process undesirably complex.

A process for manufacturing a bipolar IC, as shown in FIGS. 2A and 2B, is known as a process for manufacturing the semiconductor device, which eliminates the above drawback. According to this process, as shown in FIG. 2A, an $n^+$-type buried layer 11 is formed in, e.g., a p-type silicon substrate 1, and an n-type silicon epitaxial growth layer 12 is formed on the p-type silicon substrate 1. Thereafter, $p^+$-type isolation diffused regions 13 and 14, and a p-type base region 15 are formed. An $SiO_2$ film 16 is then formed on the surface of the silicon epitaxial growth layer 12. The predetermined portions of the $SiO_2$ film 16 are etched to form openings 16a and 16b.

In the same manner as described in connection with FIG. 1C, $POCl_3$ is used as a source of impurity diffusion, and the resultant structure is heated in an $O_2$ atmosphere at a high temperature of 1,000° C. or more to diffuse phosphorus ions via the openings 16a and 16b with the result of the formation of an $n^+$-type emitter region 17 and an $n^+$-type collector electrode region 18, respectively, as shown in FIG. 2B. At the same time, a gettering phosphorus diffused layer 4 is formed on the lower surface of the p-type silicon substrate 1. In this case, a $P_2O_5$-based PSG film 19 is formed on the $SiO_2$ film 16, the emitter region 17, and the collector electrode region 18. A $P_2O_5$-based PSG film 20 is similarly formed on the phosphorus diffused layer 4. The n-type silicon epitaxial growth layer 12, which is present between the base region 15 and the buried layer 11, constitutes a collector region 21.

According to the above manufacturing process shown in FIGS. 2A and 2B, the gettering phosphorus diffused layer 4 can be formed by diffusion for forming the emitter region 17. Therefore, as compared with the manufacturing steps shown in FIGS. 1A to 1E, the manufacturing process can be simplified. However, if atoms of the type other than phosphorus, that is, arsenic (As) atoms are used to form the emitter region 17, the manufacturing process shown in FIGS. 2A and 2B cannot be used. In addition, since it is difficult to etch only the PSG film 19, the PSG film 19 is inevitably left in the finished product. This PSG film absorbs moisture and undesirably degrades reliability of the semiconductor device.

DISCLOSURE OF INVENTION

It is an object of the present invention to provide a process for manufacturing a semiconductor device, which eliminates the above-described conventional drawbacks.

The process for manufacturing semiconductor devices according to the present invention comprises a step for thermally oxidizing semiconductor substrates to form first and second oxide films on one main surface and on another main surface thereof, respectively; a step for selectively implanting impurity ions via said first oxide film to form elements in said semiconductor substrates; a step for successively forming a film that constitutes a source of impurity diffusion and a protective film on said second oxide film; and a step of common heat-treatment for forming predetermined diffused layers on said one main surface of said semiconductor substrates by diffusing at least one kind of the impurity ions that are implanted, and for forming a diffused layer on said another main surface of said semiconductor substrates by diffusing impurities contained in the film that constitues said source of impurity diffusion into said semiconductor substrates via said second oxide film. This makes it possible to effectively perform the gettering of very fine defects and to prevent adverse effects caused by the heat-treatment. Therefore, a semiconductor device having improved reliability can be produced. Moreover, the manufacturing steps are relatively simple, and various impurities can be used to form elements, presenting great convenience from the standpoint of production.

Impurities for forming the above elements may be boron, phosphorus, arsenic, or other impurities, depending on the conductivity types of layers to be formed by diffusion.

For the above film that constitutes a source of impurity diffusion, a PSG film and any other film may be used.

The above protective film may be an $SiO_2$ film or any other film if only the out diffusion of the impurity contained in the film which constitutes the source of impurity diffusion can be prevented.

The thickness of the first oxide film is not critical, if only the impurity ions can be implanted in the semiconductor substrate via the first oxide film. The thickness of the second oxide film is also not critical, if only the impurity ions contained in the film which constitutes the source of impurity diffusion can be diffused in the semiconductor substrate through the second oxide film. Preferably, the thicknesses of the first and second oxide films are in the range of 50 to 500 Å.

Depending on semiconductor devices to be manufactured, the above semiconductor substrate may be an n- or p-type silicon substrate, a substrate of any other material, or substrate having a silicon layer or any other semiconductor layer on the silicon substrate.

BEST MODE FOR CARRYING OUT THE INVENTION

One embodiment will now be described with reference to the accompanying drawings wherein a process for manufacturing a semiconductor device according to the present invention is applied to the fabrication of a bipolar IC.

Figure 1A:
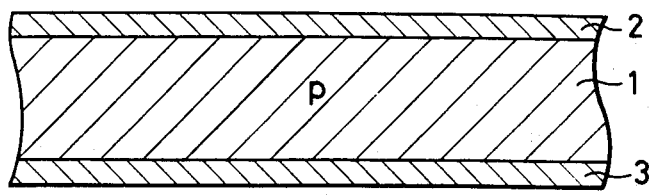
FIGS. 1A to 1E are sectional views showing one example of the sequential steps of the conventional process for manufacturing a semiconductor device.
Figure 1B:
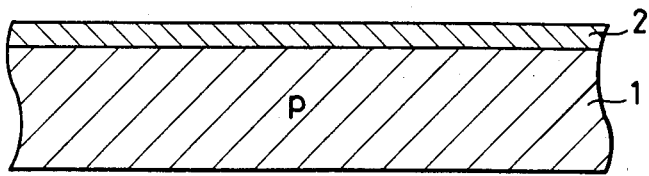
Figure 1C:
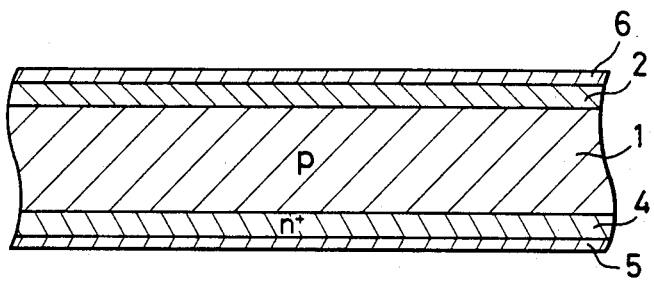
Figure 1D:
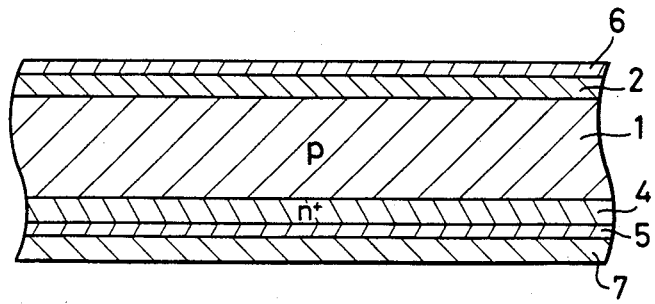
Figure 1E:
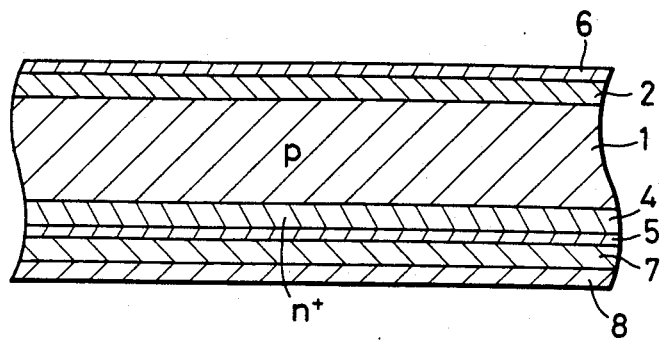
Figure 2A:
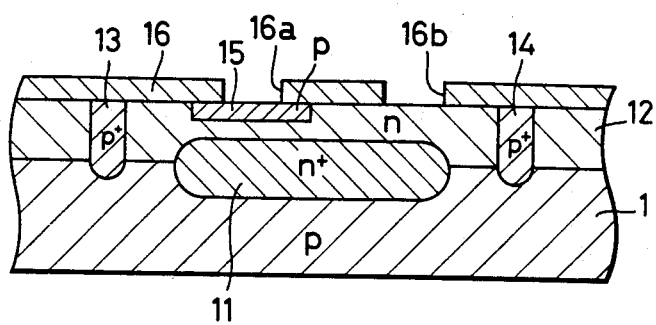
FIGS. 2A and 2B are sectional views showing one example of the sequential steps of the conventional process for manufacturing a bipolar IC.
Figure 3A:
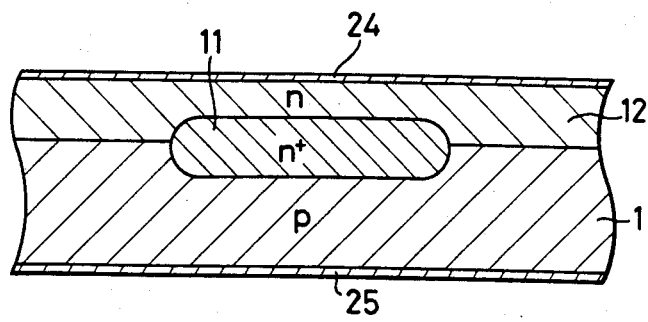
FIGS. 3A to 3G are sectional views showing one embodiment by the sequential steps wherein a process for manufacturing a semiconductor device according to the present invention is applied to the fabrication of a bipolar IC.

As shown in FIG. 3A, following the same procedures as in FIG. 2A, an n+-type buried layer 11 is formed in a p-type silicon substrate 1, and an n-type silicon epitaxial growth layer 12 is formed thereon. The surface of the silicon epitaxial growth layer 12 and the surface of the p-type silicon substrate 1 are thermally oxidized to form 150 Å-thick $SiO_2$ films 24 and 25 thereon. Damages to the silicon epitaxial growth layer 12 during ion implantation described hereinafter can be reduced owing to the presence of the $SiO_2$ films 24 and 25. At the same time, the channelling of the doped ions can be prevented, and, in addition, the nitrogenation of the surface of the silicon epitaxial growth layer 12 during heat-treatment in an $N_2$ atmosphere described hereinafter can be prevented.

Figure 3B:
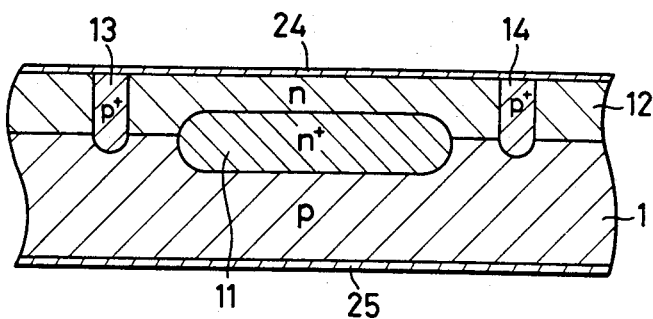
Figure 3C:
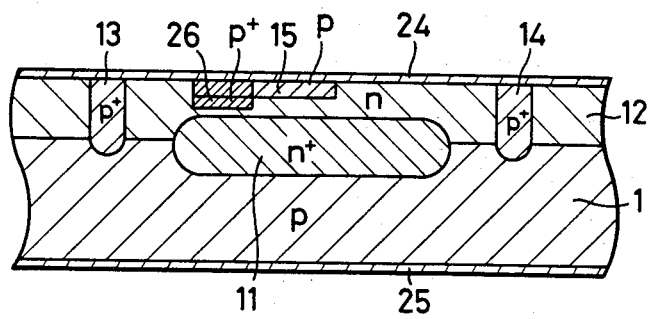

A photoresist (not shown) is then applied to the $SiO_2$ film 24 and is patterned in a predetermined shaped. Using this photoresist pattern as a mask, boron (B) is ion-implanted in a high concentration into the silicon epitaxial growth layer 12 via the $SiO_2$ film 24. After the above photoresist is removed, the resultant structure is subjected to the heat-treatment at a high temperature of about 1,000° C. in the $N_2$ atmosphere. As a result, p+-type isolation diffused regions 13 and 14 reaching the p-type silicon substrate 1 are formed, as shown in FIG. 3B. A photoresist (not shown) is applied to the $SiO_2$ film 24 and is patterned in a predetermined shape so as to form a base region 15 described hereinafter. Thereafter, using the photoresist pattern as a mask, boron ions are implanted into the silicon epitaxial growth layer 12 at predetermined conditions. After the photoresist pattern is removed, a photoresist pattern corresponding to a grafted base region 26 described hereinafter is formed using the same photoresist process as described above. By using this photoresist pattern as a mask, boron ions are again implanted into the silicon epitaxial growth layer 12 at predetermined conditions. After the photoresist pattern is removed, the resultant structure is subjected to the heat-treatment at a relatively low temperature of 1,000° C. or less in the $N_2$ atmosphere to electrically activate the implanted boron ions, thereby diffusing the ions in the direction of depth. As a result, a p-type base region 15 and a p+-type grafted base region 26 are formed, as shown in FIG. 3C.

Figure 3D:
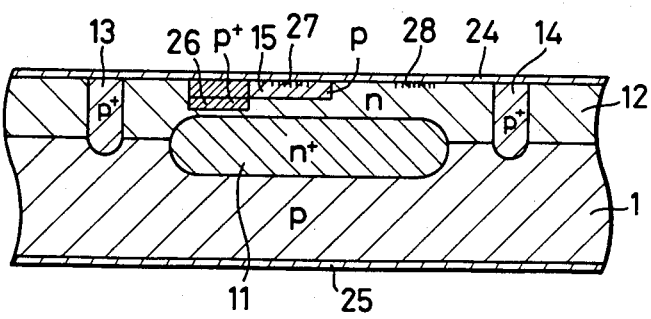

The photoresist process described above is repeated to form a predetermined photoresist pattern on the $SiO_2$ film 24. Using this photoresist pattern as a mask, arsenic ions are implanted into the silicon epitaxial growth layer 12 at predetermined conditions, thereby forming ion-implanted layer 27 and 28, as shown in FIG. 3D.

Figure 3E:
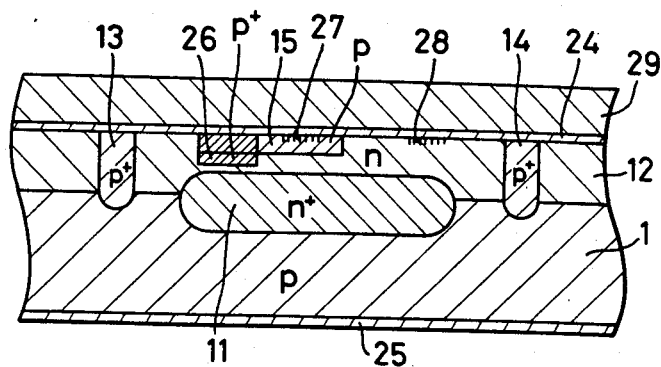

As shown in FIG. 3E, a relatively thick $SiO_2$ film 29 is formed on the $SiO_2$ film 24 by the CVD method.

Figure 3F:
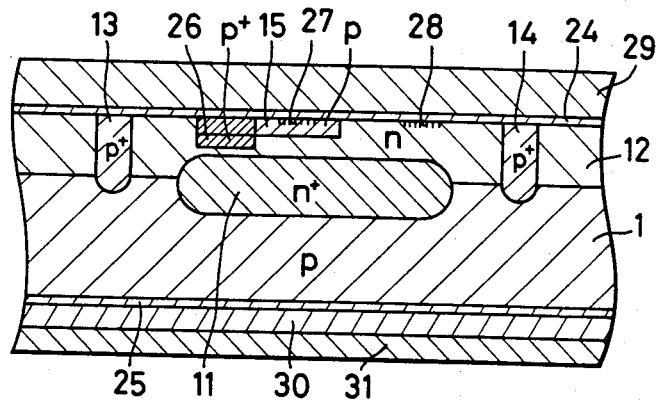

As shown in FIG. 3F, a PSG film 30 having a phosphorus concentration of, e.g., 6.9% by weight and a thickness of 2,000 Å and an $SiO_2$ film 31 having a thickness of 3,000 Å are sequentially formed by the CVD method on the $SiO_2$ film 25 formed on the lower surface of the p-type silicon substrate 1. At the time of the deposition of the PSG film 30 and the $SiO_2$ film 31, the substrate must be placed on a sample holder in a CVD apparatus in order that the $SiO_2$ film 25 formed on the lower surface of the p-type silicon substrate 1 faces upward. The silicon epitaxial growth layer 12 may therefore be damaged when it is brought into contact with the holder. However, this can be eliminated by the presence of the relatively thick $SiO_2$ film 29.

Figure 3G:
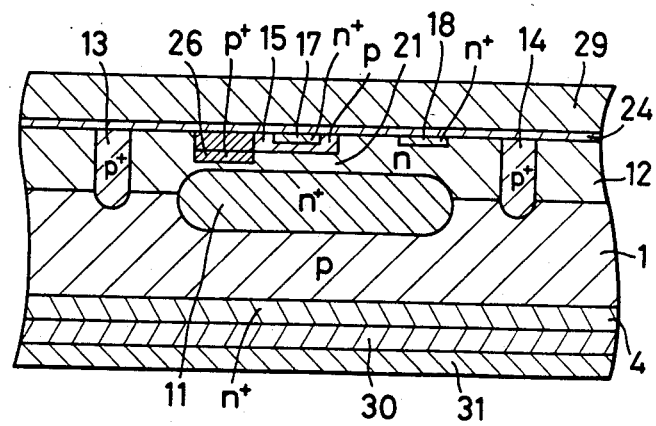

When the heat-treatment is performed in the $N_2$ atmosphere at a high temperature of about 1,000° C., the arsenic ions contained in the ion-implanted layers 27 and 28 are electrically activated, and the activated arsenic ions are diffused in the direction of depth to form an n+-type emitter region 17 and an n+-type collector electrode region 18, as shown in FIG. 3G. Similarly, the phosphorus ions contained in the PSG film 30 pass through the $SiO_2$ film 25 and are diffused in the lower surface of the p-type silicon substrate 1, thereby forming a phosphorus diffused layer 4. The above heat-treatment allows the diffusion of phosphorus ions also in the SiO$_2$ film 25, so that the SiO$_2$ film 25 is converted into a PSG film. This PSG film and the PSG film 30 formed by the CVD method are represented together as the PSG film 30 in FIG. 3G. In this case, the n-type silicon epitaxial growth layer 12, which is present between the base region 15 and the buried layer 11, constitutes a collector region 21.

Thereafter, parts of the portions of the SiO$_2$ films 29 and 24, which correspond to the grafted base region 26, the emitter region 17, and the collector electrode region 18, are etched to form respective openings (not shown). Electrodes are formed on the base region 15, the emitter region 17 and the collector region 21 via these openings, and the usual fabrication process of the bipolar IC is then performed to prepare a desired bipolar IC. When the electrode forming openings are formed by etching, the SiO$_2$ film 31 and the PSG film 30 formed on the lower surface of the p-type silicon substrate 1 are also etched to expose the phosphorus diffused layer 4. In the steps following the etching step, only the heat-treatment at a low temperature of 750° C. or less is performed, and thus phosphorus out diffusion is substantially negligible.

In order to evaluate reliability of the bipolar IC manufactured in the above embodiment, a BT test was performed in such a way that a reverse bias voltage is applied to the junction between the emitter and the base at 175° C. for a predetermined period of time. The values of h$_{FE}$ before and after the test were measured. Even after a 552-hour BT test, the changes in h$_{FE}$ were within the range of ±3%. For comparison, the same BT test as described above was performed for a bipolar IC having no phosphorus diffused layer 4. In this case, the h$_{FE}$ of, for example, 130 before the test was greatly changed to 80 after the test. As is apparent from these test results, the reliability of the bipolar IC manufactured in the above embodiment is far better than that of the bipolar IC having no phosphorus diffused layer. This indicates that the gettering has effectively been performed by the phosphorus diffused layer 4 formed on the lower surface of the p-type silicon substrate 1. The best reliability was obtained when a sheet resistance (corresponding to a phosphorus concentration) of the phosphorus diffused layer 4 was 20 Ω/□.)

According to the above embodiment, the common heat-treatment in the step of FIG. 3G is performed to form the emitter region 17 and the collector electrode region 18, and, at the same time, to form the gettering phosphorus diffused layer 4 on the lower surface of the p-type silicon substrate 1. Therefore, the manufacturing steps can be simplified as compared with the conventional fabrication process shown in FIGS. 1A to 1E. In the step of FIG. 3G the phosphorus ions contained in the PSG film 30 are diffused in the lower surface of the p-type silicon substrate 1 via the SiO$_2$ film 25 to form the phosphorus diffused layer 4. So, it is not necessary to etch the SiO$_2$ film 25, which would not otherwise be required, thus further simplifying the manufacturing steps.

Figure 2B:
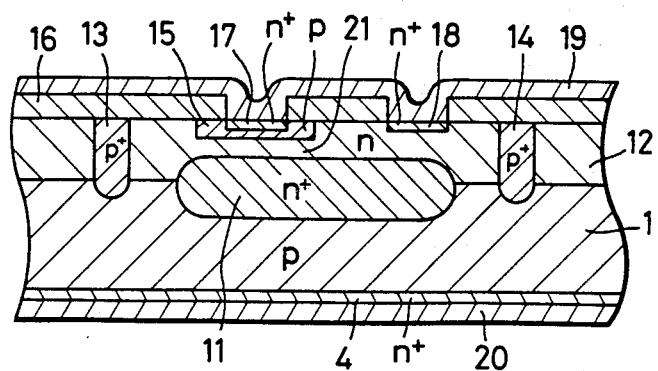

According to the embodiment described above, the PSG film 30 is used as a source of impurity diffusion to form the phosphorus diffused layer 4, thus presenting the following advantage. In the conventional fabrication process shown in FIGS. 2A and 2B the phosphorus diffused layer 4 is formed by a thermal diffusion method using POCl$_3$ as a source of impurity diffusion, as described above, and the PSG film 19 (FIG. 2B) formed during the thermal diffusion is therefore left in the finished product to cause degradation of moisture resistance. However, according to this embodiment, the above problem is completely solved. In addition, an impurity for forming the emitter region 17 may be arsenic which cannot be used in the conventional fabrication process in FIGS. 2A and 2B.

In the above embodiment, the protective film comprising the SiO$_2$ film 31 is formed on the PSG film 30 in the step shown in FIG. 3F. Therefore, the out diffusion of phosphorus ions from the PSG film 30 during the high-temperature heat-treatment in the step of FIG. 3G can be effectively prevented.

In the above embodiment there has been described the case wherein the process for manufacturing a semiconductor device is applied to the fabrication of the bipolar IC. However, the method of the present invention may also be applied to the fabrication of other semiconductor devices such as MOSICs and CCDs.

I claim:

1. A process for manufacturing a semiconductor device, characterized by comprising a step of thermally oxidizing semiconductor substrates of opposite conductivity types to form first and second oxide films on one main surface and on another main surface thereof, respectively; a step of selectively implanting impurity ions via said first oxide film to form diffused zones in said semiconductor substrates; a step of successively forming a film that constitutes a source of impurity diffusion of opposite conductivity type and a protective film confined to said second oxide film; and a step of common heat-treatment for forming predetermined diffused layers on said one main surface of said semiconductor substrates by diffusing at least one kind of the impurity ions that are implanted, and for forming a diffused layer on said another main surface of said semiconductor substrates by diffusing impurities contained in the film that constitutes said source of impurity diffusion into said semiconductor substrates via said second oxide film.

* * * * *